(12) United States Patent
Maejima et al.

(10) Patent No.: US 7,259,990 B2
(45) Date of Patent: Aug. 21, 2007

(54) SEMICONDUCTOR MEMORY DEVICE

(75) Inventors: Hiroshi Maejima, Chigasaki (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 11/193,456

(22) Filed: Aug. 1, 2005

(65) Prior Publication Data

US 2006/0023512 A1    Feb. 2, 2006

(30) Foreign Application Priority Data

Aug. 2, 2004    (JP) .............................. 2004-225025

(51) Int. Cl.
*G11C 11/34* (2006.01)

(52) U.S. Cl. .............................. 365/185.17; 365/185.25

(58) Field of Classification Search ........... 365/185.17, 365/185.18, 185.25, 185.29, 185.33
See application file for complete search history.

(56) References Cited

U.S. PATENT DOCUMENTS

| | | | | |
|---|---|---|---|---|
| 5,253,206 | A * | 10/1993 | Tanaka et al. | 365/185.17 |
| 5,768,188 | A * | 6/1998 | Park et al. | 365/185.17 |
| 5,808,935 | A * | 9/1998 | Kwon et al. | 365/185.17 |
| 6,058,044 | A * | 5/2000 | Sugiura et al. | 365/185.17 |
| 6,813,214 | B2 * | 11/2004 | Cho et al. | 365/185.17 |
| 7,006,379 | B2 * | 2/2006 | Noguchi et al. | 365/185.17 |

FOREIGN PATENT DOCUMENTS

JP    8-87895    4/1996

OTHER PUBLICATIONS

Tomoharu Tanaka et al., "A Quick Intelligent Page-Programming Architecture and a Shielded Bitline Sensing Method for 3 V—Only NAND Flash Memory", IEEE Journal of Solid-State Circuits, vol. 29, No. 11, Nov. 1994, p. 1366-1373.

* cited by examiner

*Primary Examiner*—Trong Phan
(74) *Attorney, Agent, or Firm*—Oblon, Spivak, McClelland, Maier & Neustadt, P.C.

(57) ABSTRACT

A semiconductor memory device is disclosed, which includes a plurality of NAND cells each comprising a plurality of series-connected memory cell transistors, and a drain-side select transistor and a source-side select transistor connected to a drain-side end and a source-side end of the series-connected memory cell transistors, respectively, a source line commonly connected to the source-side select transistors in the plurality of NAND cells, a first discharge circuit which is connected between the source line and a reference potential and whose conduction/non-conduction is controlled by a first control signal, and a second discharge circuit which is connected between the source line and the reference potential and whose conduction/non-conduction is controlled by a second control signal different from the first control signal.

21 Claims, 7 Drawing Sheets

SEMICONDUCTOR MEMORY DEVICE

CROSS-REFERENCE TO RELATED APPLICATIONS

This application is based upon and claims the benefit of priority from prior Japanese Patent Application No. 2004-225025, filed Aug. 2, 2004, the entire contents of which are incorporated herein by reference.

BACKGROUND OF THE INVENTION

1. Field of the Invention

The present invention relates to a semiconductor memory device, and particularly to a discharge circuit in a nonvolatile semiconductor memory device such as a NAND flash memory.

2. Description of the Related Art

Figure 1:
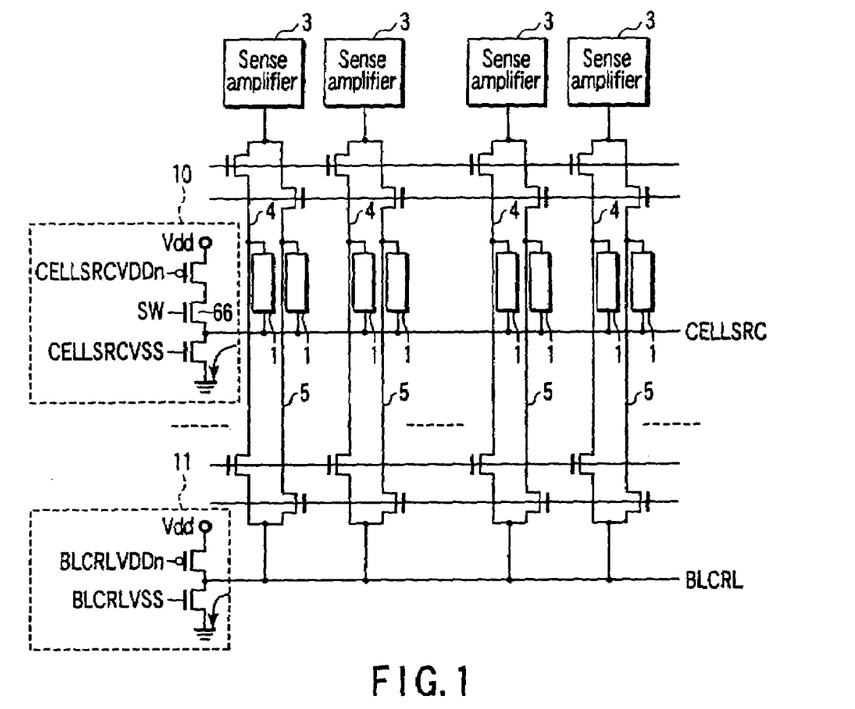
FIG. 1 is a circuit diagram of a core portion of a NAND flash memory.
Figure 2:
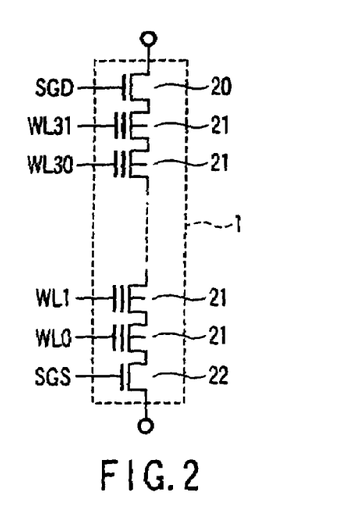
FIG. 2 is a circuit diagram of a NAND string of the core portion shown in FIG. 1.
Figure 3:
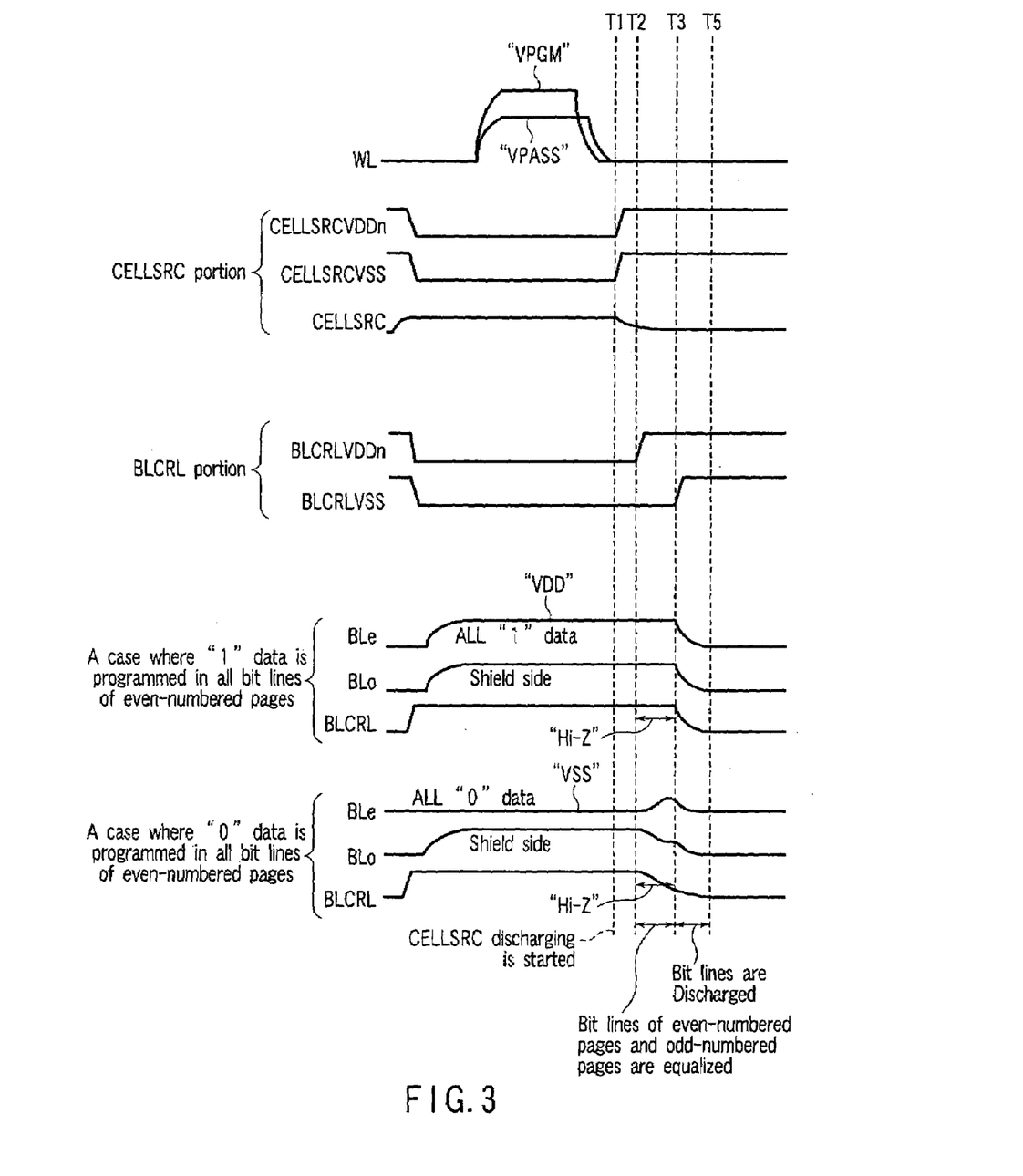
FIG. 3 is a signal waveform diagram showing a recovery operation of the NAND flash memory.

FIG. 1 shows a core portion of a NAND flash memory, and FIG. 2 shows a structure of a NAND cell 1 of FIG. 1. Further, FIG. 3 shows signal waveforms at the time of programming in the NAND flash memory of FIG. 1. Hereinafter, a programming operation of the NAND flash memory will be briefly described with reference to the drawings.

Each of NAND strings 1 comprises, as shown in FIG. 2, a drain-side select transistor 20 connected to a bit line, a plurality of memory cell transistors 21, and a source-side select transistor 22 connected to a cell source line CELLSRC. A gate of the select transistor 20 is connected to a select gate SGD, and a gate of the select transistor 22 is connected to a select gate SGS, respectively. When data is programmed in one of the plurality of memory cell transistors 20 in the NAND string 1, the data to be programmed is transmitted to a selected bit line 5 via a sense amplifier 3. The adjacent non-select bit line 4 is charged to a power supply potential Vdd via a bit line shield line BLCRL. The bit line 4 corresponds to an even-numbered page in a memory cell array, and the bit line 5 corresponds to an odd-numbered page in the memory cell array, respectively. The cell source line CELLSRC is precharged to a potential not ground potential Vss (a Vdd potential or a potential which is lower than Vdd by a threshold voltage of the transistor) in order to suppress a current leakage to the select gate SGS side in channel boosting. When a word line WL is driven and data programming into the memory cell is terminated, a recovery operation is carried out. In the recovery operation, the bit line shield line BLCRL and the cell source line CELLSRC are discharged via discharge circuits 11 and 10, respectively. The discharge circuit 10 is controlled by a control signal CELLSRCVSS, and the discharge circuit 11 is controlled by a control signal BLCRLVSS, respectively (Jpn. Pat. Appln. KOKAI Publication No. 8-87895).

Figure 4:
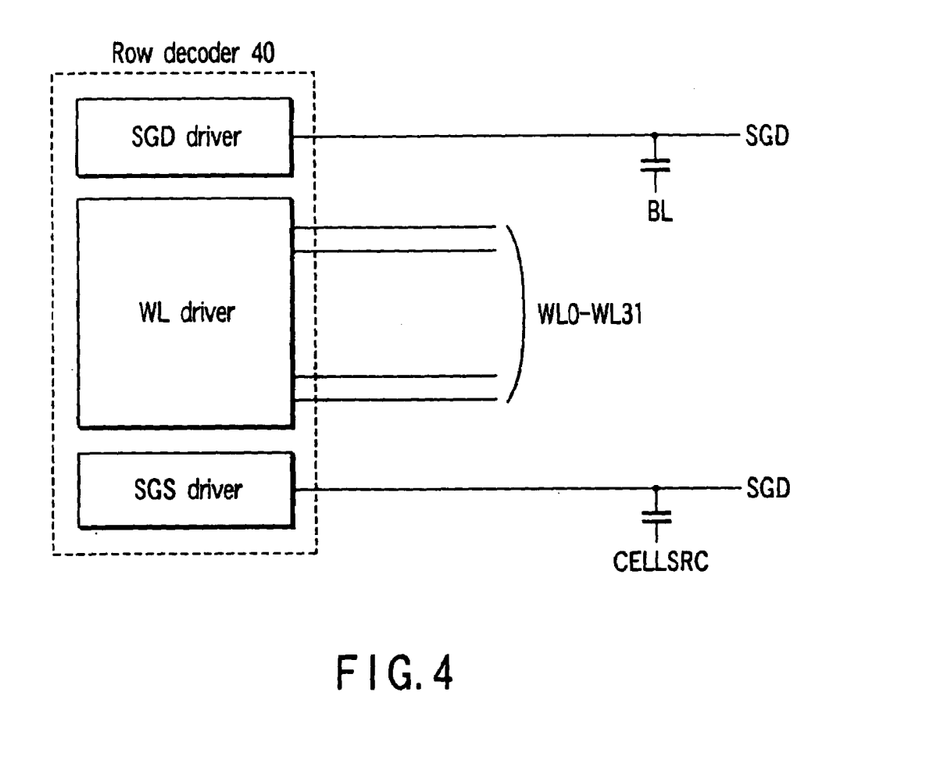
FIG. 4 is a block diagram of a row decoder.

As shown in the signal waveforms of FIG. 3, the cell source line CELLSRC is discharged to Vss via the discharge circuit 10. Substantially at the same timing, the bit lines 4 and 5 are equalized and then are discharged to Vss via the bit line shield line BLCRL and the discharge circuit 11. FIG. 4 shows a row decoder 40 including a SGD driver which drives the select gate SGD, a WL driver which drives word lines WL0 to WL31, and a SGS driver which drives the select gate SGD. The inventors of the present application have found that when the cell source line CELLSRC and the bit lines 4, 5 are discharged, a PN junction in the row decoder 40 is biased in a forward direction to cause a bipolar operation. This is assumed to be based on the following reasons.

Figure 5:
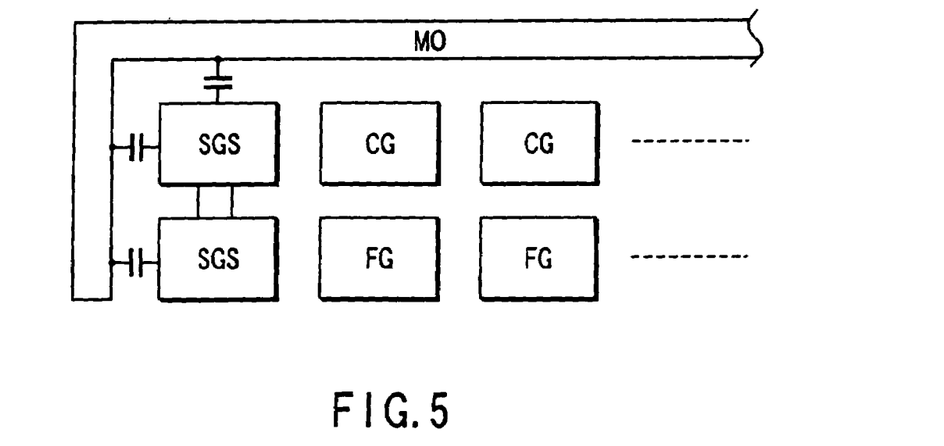
FIG. 5 is a cross sectional view of part of the NAND string shown in FIG. 2.

FIG. 5 shows a cross sectional view of the select gate SGS and the memory cell transistors in the NAND string. The select gate SGS has strong capacitive coupling of about 20% to 40% to the cell source line CELLSRC formed of a metal wiring M0. Further, the select gate SGD (not shown) has strong capacitive coupling of about 20% to 40% to a bit line formed of a metal wiring (not shown). Thus, when the cell source line CELLSRC and the bit lines 4 and 5 are rapidly discharged to Vss in the recovery operation, the potentials of the select gates SGS and SGD tend to lower from Vss, which is supplied from the driver side, to a negative potential. How much the select gates SGS and SGD lower depends on a discharge rate at which the cell source line CELLSRC and the bit lines are discharged to Vss, the strength of the capacitive coupling of the select gates SGS and SGD, a potential supply capability of the driver, and the like.

BRIEF SUMMARY OF THE INVENTION

According to an aspect of the present invention, there is provided a semiconductor memory device comprising:

a plurality of NAND cells each comprising a plurality of series-connected memory cell transistors, and a drain-side select transistor and a source-side select transistor connected to a drain-side end and a source-side end of the series-connected memory cell transistors, respectively;

a source line commonly connected to the source-side select transistors in the plurality of NAND cells;

a first discharge circuit which is connected between the source line and a reference potential and whose conduction/non-conduction is controlled by a first control signal; and a second discharge circuit which is connected between the source line and the reference potential and whose conduction/non-conduction is controlled by a second control signal different from the first control signal.

According to another aspect of the present invention, there is provided a semiconductor memory device comprising:

a plurality of bit lines connected to a plurality of NAND cells;

a shield line commonly connected to the plurality of bit lines;

a first discharge circuit which is connected between the shield line and a reference potential and whose conduction/non-conduction is controlled by a first control signal; and a second discharge circuit which is connected between the shield line and the reference potential and whose conduction/non-conduction is controlled by a second control signal different from the first control signal.

According to a further aspect of the present invention, there is provided a semiconductor memory device comprising:

a plurality of NAND cells each comprising a plurality of series-connected memory cell transistors, and a drain-side select transistor and a source-side select transistor connected to a drain-side end and a source-side end of the series-connected memory cell transistors, respectively;

a source line commonly connected to the source-side select transistors of the plurality of NAND cells;

a first discharge circuit which is connected between the source line and a reference potential and whose conduction/non-conduction is controlled by a first control signal;

a second discharge circuit which is connected between the source line and the reference potential and whose conduction/non-conduction is controlled by a second control signal different from the first control signal;

a plurality of bit lines connected to the plurality of NAND cells;

a shield line commonly connected to the plurality of bit lines;

a third discharge circuit which is connected between the shield line and the reference potential and whose conduction/non-conduction is controlled by a third control signal; and a fourth discharge circuit which is connected between the shield line and the reference potential and whose conduction/non-conduction is controlled by a fourth control signal different from the third control signal.

DETAILED DESCRIPTION OF THE INVENTION

An embodiment according to the present invention will be described below with reference to the drawings.

Figure 6:
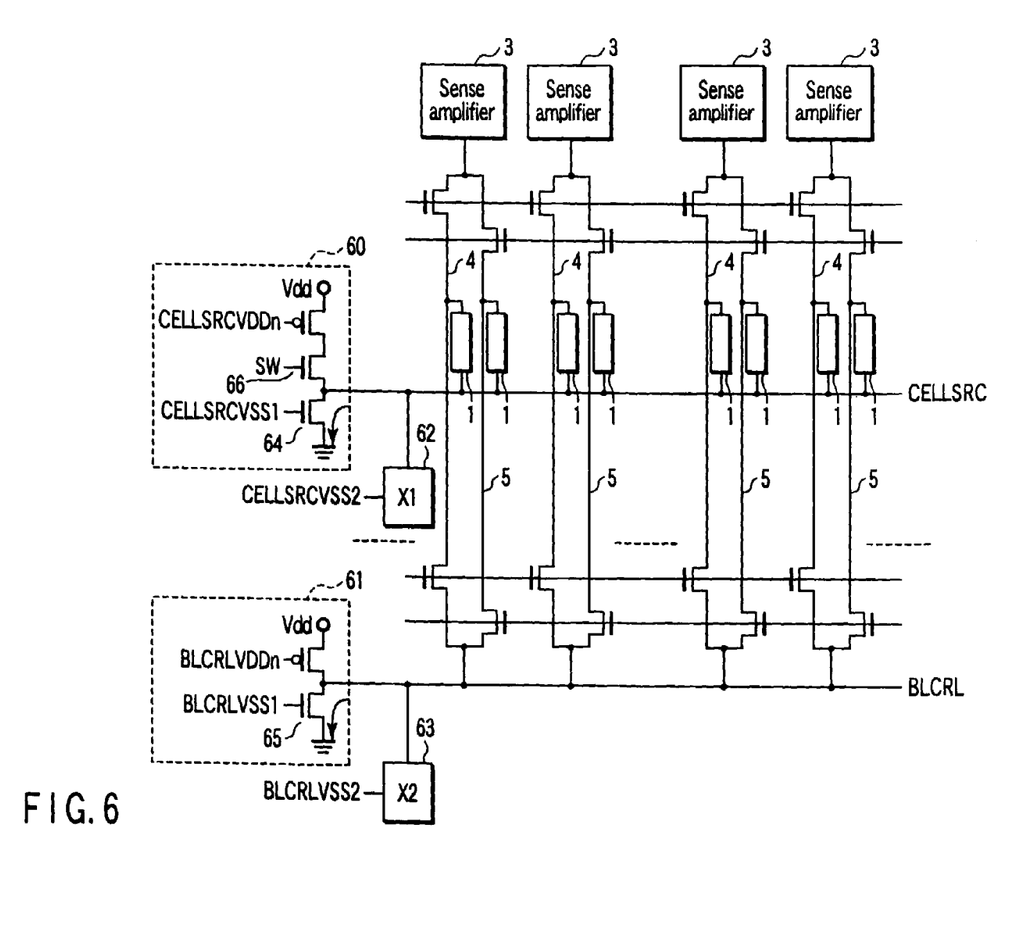
FIG. 6 is a circuit diagram of the core portion of the NAND flash memory according to an embodiment of the present invention.

FIG. 6 shows a circuit example of a NAND flash memory according to the embodiment of the present invention. The same numerals are denoted to the same parts as those in the circuit of FIG. 1.

In FIG. 6, a cell source line CELLSRC is provided with discharge circuits 60 and 62, and a bit line shield line BLCRL is provided with discharge circuits 61 and 63. The discharge circuit 60 is controlled by a control signal CELLSRCVSS1, the discharge circuit 61 is controlled by a control signal BLCRLVSS1, the discharge circuit 62 is controlled by a control signal CELLSRCVSS2, and the discharge circuit 63 is controlled by a control signal BLCRLVSS2. The discharge circuit 60 includes an n-channel MOS transistor 64 controlled by the control signal CELLSRCVSS1, and the discharge circuit 61 includes an n-channel MOS transistor 65 controlled by the control signal BLCRLVSS1. The discharge circuits 60 through 63 perform discharge operation to the ground potential Vss when the input control signal becomes high level ("H"). Two n-channel MOS transistors 64 and 66 of the discharge circuit 60 have an oxide film thicker than the n-channel MOS transistor 65 of the discharge circuit 61 to thereby have a higher breakdown voltage than the n-channel MOS transistor 65 of the discharge circuit 61.

Figure 7A:
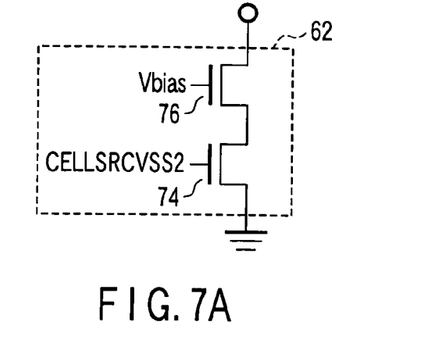
FIG. 7A is a circuit diagram of a discharge circuit 62 shown in FIG. 6.
Figure 7B:
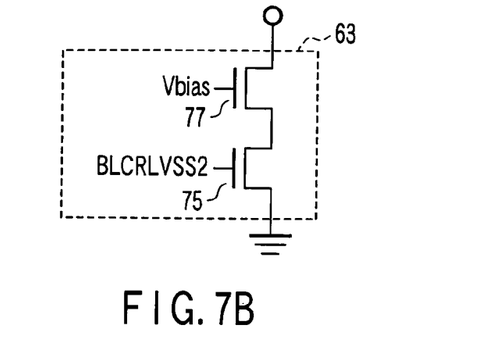
FIG. 7B is a circuit diagram of a discharge circuit 63 shown in FIG. 6.

FIGS. 7A and 7B show circuit examples of the discharge circuit 62 and the discharge circuit 63 in the NAND flash memory of FIG. 6, respectively.

In FIG. 7A, the discharge circuit 62 is comprised of a constant current circuit, in which an n-channel MOS transistor 76 controlled by Vbias and an n-channel MOS transistor 74 controlled by CELLSRCVSS2 are series-connected. In FIG. 7B, the discharge circuit 63 is comprised of a constant current circuit, in which the n-channel MOS transistor 77 controlled by Vbias and an n-channel MOS transistor 75 controlled by BLCRLVSS2 are series-connected. The source of each of the n-channel MOS transistors 74 and 75 is connected to the ground potential Vss. A driving capability of the n-channel MOS transistor 74 is set to be lower than that of the n-channel MOS transistor 64 in the discharge circuit 60. A driving capability of the n-channel MOS transistor 75 is set to be lower than that of the n-channel MOS transistor 65 in the discharge circuit 61. The driving capabilities of these MOS transistors can be changed by changing, for example, a ratio between a gate width W and a gate length L. The two n-channel MOS transistors 74 and 76 of the discharge circuit 62 have an oxide film thicker than the two n-channel MOS transistors 75 and 77 of the discharge circuit 63 to thereby have a higher breakdown voltage than the two n-channel MOS transistors 75 and 77 of the discharge circuit 63.

Figure 8A:
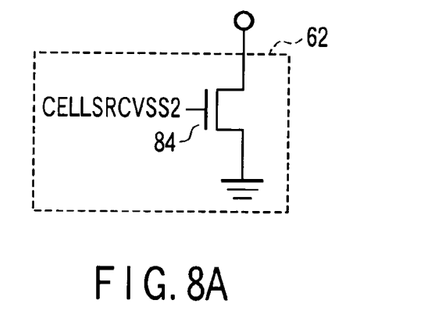
FIG. 8A is another circuit diagram of the discharge circuit 62 shown in FIG. 6.
Figure 8B:
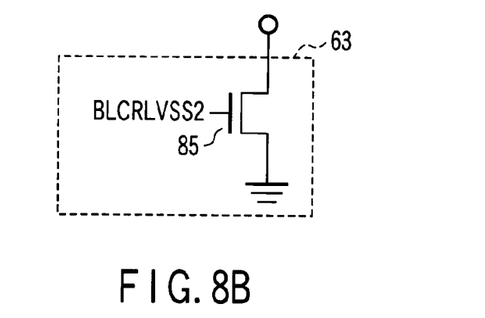
FIG. 8B is another circuit diagram of the discharge circuit 63 shown in FIG. 6.

FIGS. 8A and 8B show another circuit examples of the discharge circuit 62 and the discharge circuit 63 in the NAND flash memory of FIG. 6, respectively.

In FIG. 8A, the discharge circuit 62 is comprised of a constant current circuit including an n-channel MOS transistor 84 controlled by CELLSRCVSS2. In FIG. 8B, the discharge circuit 63 is comprised of a constant current circuit including an n-channel MOS transistor 85 controlled by BLCRLVSS2. Each of the sources of these n-channel MOS transistors 84 and 85 is connected to the ground potential Vss. A driving capability of the n-channel MOS transistor 84 is set to be lower than that of the n-channel MOS transistor 64 of the discharge circuit 60. Further, a driving capability of the n-channel MOS transistor 85 is set to be lower than that of the n-channel MOS transistor 65 of the discharge circuit 61. The n-channel MOS transistor 84 of the discharge circuit 62 has an oxide film thicker than the n-channel MOS transistor 85 of the discharge circuit 63 to thereby have a higher breakdown voltage than the n-channel MOS transistor 85 of the discharge circuit 63.

Figure 9:
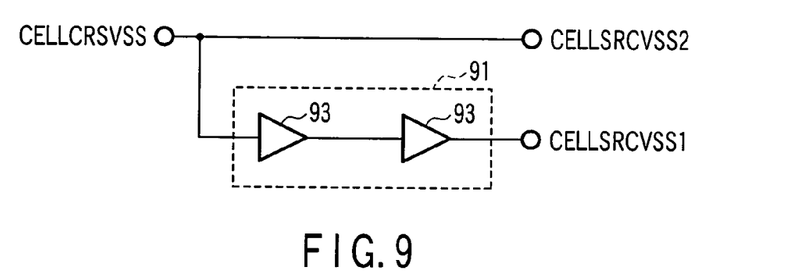
FIG. 9 is a circuit diagram of a discharge control signal generation circuit for generating signals for controlling discharge circuits 60 and 62 shown in FIG. 6.

FIG. 9 shows a discharge control signal generating circuit which receives a signal CELLSRCVSS and generates the control signals CELLSRCVSS1 and CELLSRCVSS2 for controlling the discharge circuits 60 and 62. The input signal CELLSRCVSS inputted to the generating circuit is outputted as it is from this generating circuit to the discharge circuit 62 as CELLSRCVSS2. On the other hand, the input signal CELLSRCVSS inputted to the generating circuit is delayed by a delay circuit 91 and outputted to the discharge circuit 60 as the control signal CELLSRCVSS1. The delay circuit 91 comprises, for example, a plurality of series-connected buffer circuits 93. In FIG. 9, the delay circuit 91 is comprised of two series-connected buffer circuits 93. Each of the buffer circuits 93 is formed of two series-connected CMOS transistors. A delay time T due to the delay circuit 91 depends on the number of stages of the series-connected buffer circuits 93. Thus, the discharge circuit 60 which starts operation in response to the delay control signal CELLSRCVSS1 from the delay circuit 91 starts discharging later by the delay time T than the discharge circuit 62.

Figure 10:
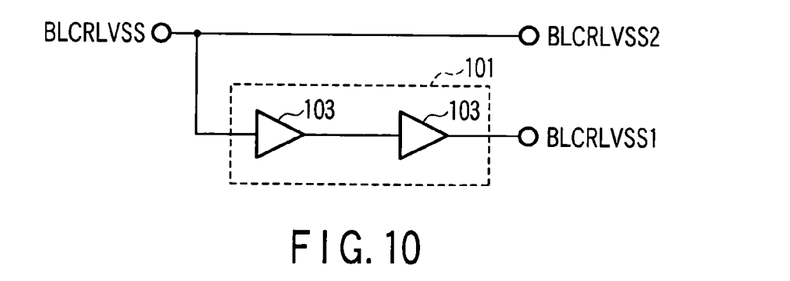
FIG. 10 is a circuit diagram of discharge control signal generation circuit for generating signals for controlling discharge circuits 61 and 63 shown in FIG. 6.

FIG. 10 shows a discharge control signal generating circuit which receives a signal BLCRLVSS and generates the control signals BLCRLVSS1 and BLCRLVSS2 for controlling the discharge circuits 61 and 63. The input signal BLCRSVSS inputted to this generating circuit is outputted as it is from the generating circuit to the discharge circuit 63 as BLCRLVSS2. On the other hand, the input signal BLCRSVSS inputted to the generating circuit is delayed by a delay circuit 101 and outputted to the discharge circuit 61 as the control signal BLCRLVSS1. The delay circuit 101 comprises, for example, a plurality of series-connected buffer circuits 103. In FIG. 10, the delay circuit 101 is comprised of two series-connected buffer circuits 103. Each of the buffer circuits 103 is formed of two series-connected CMOS transistors. A delay time T due to the delay circuit 101 depends on the number of stages of the series-connected buffer circuits 103. Thus, the discharge circuit 61 which starts operation in response to the delay control signal BLCRLVSS1 from the delay circuit 101 starts discharging later by the delay time T than the discharge circuit 63. As described in conjunction with FIGS. 7A and 8A, the driving capabilities of the n-channel MOS transistors 74 and 84 of the discharge circuit 62 are set to be lower than that of the n-channel MOS transistor 64 of the discharge circuit 60. Further, as described in conjunction with FIGS. 7B and 8B, the driving capabilities of the n-channel MOS transistors 75 and 85 of the discharge circuit 63 are set to be lower than that of the n-channel MOS transistor 65 of the discharge circuit 61. The n-channel MOS transistors in the discharge circuits 62 and 63 whose driving capabilities are set to be lower start discharging earlier than the n-channel MOS transistors 64 and 65 in the discharge circuits 60 and 61. Thus, the bit lines 4, 5 and the cell source line CELLSRC are not rapidly discharged so that it is prevented that the select gates SGS and SGD are lowered from the potential Vss supplied from the driver side to a negative potential.

Although in FIG. 9 there is shown an example where CELLSRCVSS1 and CELLSRCVSS2 are generated from the control signal CELLSRCVSS, the control circuit in the NAND flash memory may generate CELLSRCVSS1 and CELLSRCVSS2 by using an inner timer. This method is applicable also to the control signals BLCRLVSS1 and BLCRLVSS2.

The driving capabilities of the n-channel MOS transistors 74, 75, 84 and 85 in the discharge circuits 62 and 63 may be equal to the driving capabilities of the n-channel MOS transistors 64 and 65 in the discharge circuits 60 and 61. For example, when 100% of the driving capability is required for discharging the cell source line CELLSRC, instead of providing one n-channel MOS transistor having 100% driving capability in the discharge circuit 60, an n-channel MOS transistor having 50% driving capability may be provided in the discharge circuit 60, and another n-channel MOS transistor having 50% driving capability may be provided in the discharge circuit 62.

Next, a recovery operation after a programming operation according to the present embodiment will be described with reference to FIG. 11.

At first, when a state machine in the NAND flash memory makes the control signal CELLSRCVSS high level ("H") at time T1, the control signal CELLSRCVSS2 also becomes "H" and the discharging of the cell source line CELLSRC is started by the discharge circuit 62. Next, at time T2, a control signal BLCRLVDDn is made "H" and a path for connecting the bit line shield line BLSRL to Vdd is separated. At the same time, BLASe and BLASo are made "H" so that a pair of bit lines which are connected to an even-numbered page and an odd-numbered page are equalized via the bit line shield line BLCRL. Next, at time T3, when the state machine in the NAND flash memory makes the control signal BLCRLVSS "H", the control signal BLCRLVSS2 also becomes "H", and the discharging of the bit lines is started by the discharge circuit 63. Next, at time T4, the control signal BLCRLVSS1 also becomes "H" and the discharging of the bit lines is started by the discharge circuit 61. Also, at time T4, the control signal CELLSRCVSS1 becomes "H" and the discharging of the cell source line CELLSRC is started by the discharge circuit 61. Here, the period from time T1 to time T4 is equal to the delay time due to the delay circuit 91 of FIG. 9. Further, the period from time T3 to time T4 is equal to the delay time due to the delay circuit 101 of FIG. 10.

Figure 11:
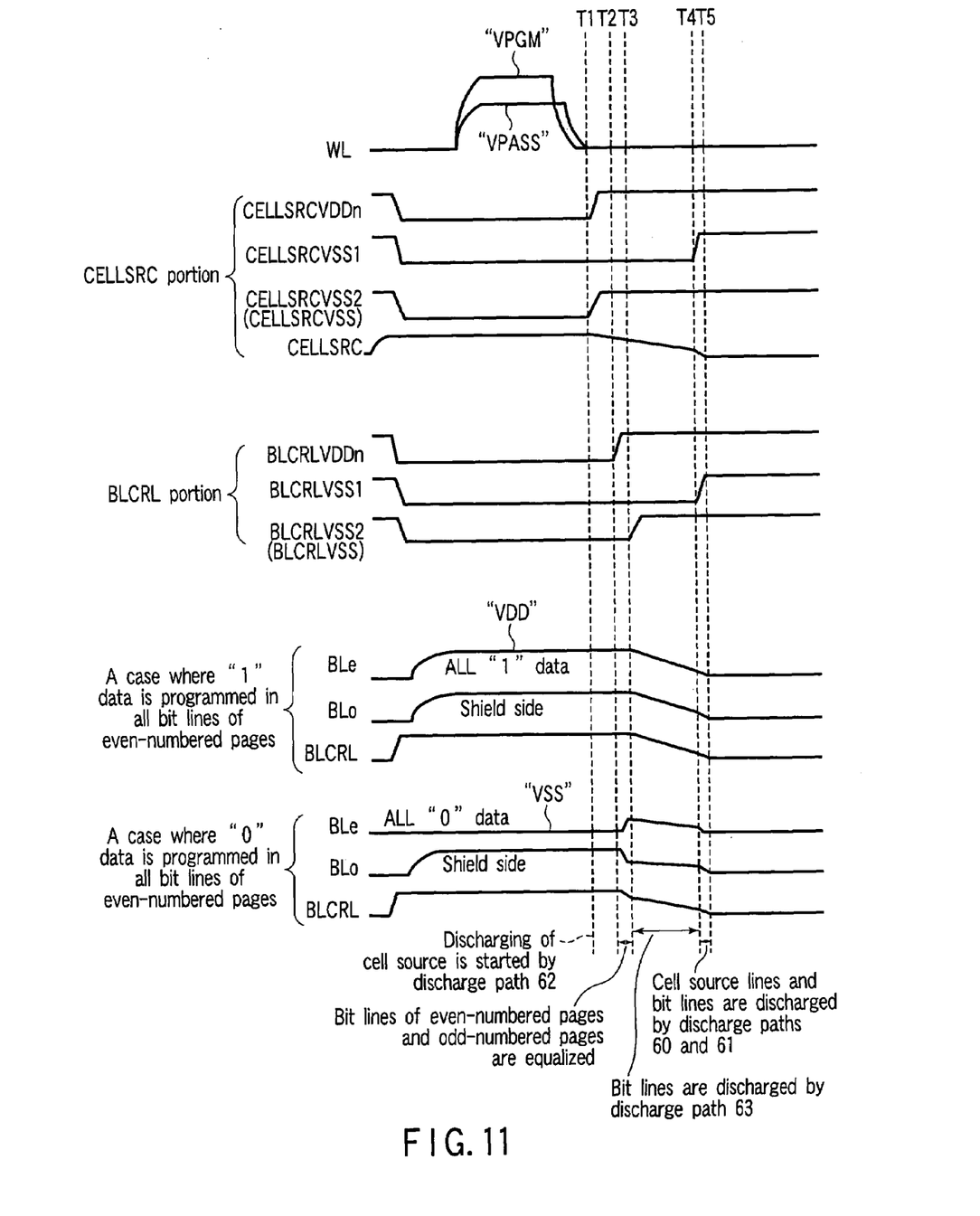
FIG. 11 is a signal waveform diagram showing a recovery operation of the NAND flash memory according to the embodiment of the present invention.

As can be seen from comparison between FIG. 11 and FIG. 3, in FIG. 11, an equalize time (T3-T2) of the bit lines is shorter. The period from time T3 to time T5 is accordingly longer, and the bit lines are slowly discharged during the longer period from time T3 to time T5. Only one of the two discharge circuits operates both when the discharging of the cell source line is started and when the discharging of the bit lines is started. Thus, both when the cell source line CELLSRC is discharged and when the bit line is discharged, there is reduced a possibility that the pn junction in the row decoder 40 is biased in the forward direction to cause the bipolar operation.

Figure 12:
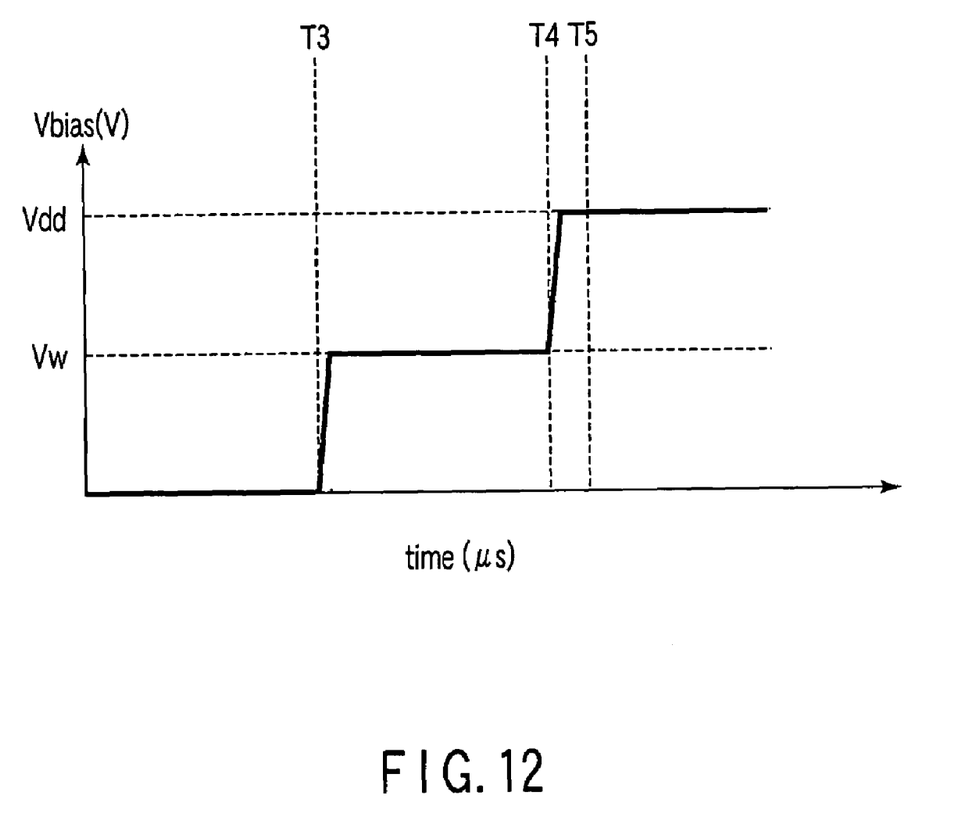
FIG. 12 is a timing chart showing a change in control voltage Vbias in the discharge circuits as shown in FIGS. 7A and 7B.

FIG. 12 is a timing chart showing a change in the control voltage Vbias shown in FIGS. 7A and 7B. The control voltage Vbias is made an intermediate potential Vw at time T3 in FIG. 11. Thereafter, the control voltage Vbias is made a power supply potential Vdd at time T4. While the intermediate potential Vw is applied to the gate (corresponding to the time (T4-T3) of FIG. 11), the discharging capability of the n-channel MOS transistor is low. On the contrary, while the power potential Vdd is applied to the gate (corresponding to the time (T5-T4) of FIG. 11), the discharging capability of the n-channel MOS transistor becomes higher. Although the control voltage Vbias is changed in the present embodiment, Vbias may be maintained constant.

Further, the NAND flash memory according to the present invention may have, for example, a wiring width less than 0.1 micrometers and a capacity thereof having 2 gigabit or more. Such a NAND flash memory may use a wiring material including, for example, Cu (copper). Further, a memory cell array may be constructed to have the page width of 2112 bytes or 4224 bytes. When the page width is 2112 bytes, 2048 bytes are used as a user data portion and the remaining 64 bytes are used as a redundancy portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of NAND cells each comprising a plurality of series-connected memory cell transistors, a drain-side select transistor and a source-side select transistor connected to a drain-side end and a source-side end of the series-connected memory cell transistors, respectively;
a source line commonly connected to sources of the source-side select transistors in the plurality of NAND cells;
a first discharge circuit which is connected between the source line and a reference potential and configured to discharge the source line by a first control signal; and
a second discharge circuit which is connected between the source line and the reference potential and configured to discharge the source line by a second control signal, the first control signal generated by delaying the second control signal.

2. The semiconductor memory device according to claim 1, wherein the second discharge circuit is configured to discharge the source line at a timing earlier by a predetermined time than a timing when the first discharge circuit discharges the source line.

3. The semiconductor memory device according to claim 1, wherein a driving capability of the second discharge circuit is set to be lower than a driving capability of the first discharge circuit.

4. The semiconductor memory device according to claim 1, further comprising a control signal generating circuit which generates the first control signal and the second control signal.

5. The semiconductor memory device according to claim 4, wherein the control signal generating circuit comprises a delay circuit which receives a control input signal and outputs the control input signal as the second control signal to the second discharge circuit, and outputs the control input signal as the first control signal to the first discharge circuit later by a predetermined time than the second control signal.

6. The semiconductor memory device according to claim 5, wherein the second discharge circuit receives the second control signal from the delay circuit, and performs conduction at a timing earlier by the predetermined time than the first discharge circuit.

7. The semiconductor memory device according to claim 1, wherein the first discharge circuit comprises at least two n-channel MOS transistors which are series-connected between a power supply potential and the reference potential and the source line of which is connected to a mutual connection node, the second discharge circuit comprises at least one n-channel MOS transistor connected between the source line and the reference potential, and a driving capability of the at least one n-channel MOS transistor of the second discharge circuit is lower than a driving capability of one n-channel MOS transistor connected between the mutual connection node and the reference potential among the at least two n-channel MOS transistors of the first discharge circuit.

8. A semiconductor memory device comprising:
a plurality of bit lines connected to a plurality of NAND cells;
a shield line commonly connected to the plurality of bit lines;
a first discharge circuit which is connected between the shield line and a reference potential and configured to discharge the shield line by a first control signal; and
a second discharge circuit which is connected between the shield line and the reference potential and configured to discharge the shield line by a second control signal, the first control signal generated by delaying the second control signal.

9. The semiconductor memory device according to claim 8, wherein the second discharge circuit is configured to discharge the source line at a timing earlier by a predetermined time than a timing when the first discharge circuit discharges the source line.

10. The semiconductor memory device according to claim 8, wherein a driving capability of the second discharge circuit is set to be lower than a driving capability of the first discharge circuit.

11. The semiconductor memory device according to claim 8, further comprising a control signal generating circuit which generates the first control signal and the second control signal.

12. The semiconductor memory device according to claim 11, wherein the control signal generating circuit comprises a delay circuit which receives a control input signal and outputs the control input signal as the second control signal to the second discharge circuit, and outputs the control input signal as the first control signal to the first discharge circuit later by a predetermined time than the second control signal.

13. The semiconductor memory device according to claim 12, wherein the second discharge circuit receives the second control signal from the delay circuit and performs conduction at a timing earlier by the predetermined time than the first discharge circuit.

14. The semiconductor memory device according to claim 8, wherein the first discharge circuit comprises at least one n-channel MOS transistor connected between the shield line and the reference potential, the second discharge circuit comprises at least one n-channel MOS transistor connected between the shield line and the reference potential, and a driving capability of the at least one n-channel MOS transistor of the second discharge circuit is lower than a driving capability of the at least one n-channel MOS transistor of the first discharge circuit.

15. A semiconductor memory device comprising:
a plurality of NAND cells each comprising a plurality of series-connected memory cell transistors, a drain-side select transistor and a source-side select transistor connected to a drain-side end and a source-side end of the series-connected memory cell transistors, respectively;
a source line commonly connected to the source-side select transistors of the plurality of NAND cells;
a first discharge circuit which is connected between the source line and a reference potential and configured to discharge the source line by a first control signal;
a second discharge circuit which is connected between the source line and the reference potential and configured to discharge the source line by a second control signal generated by delaying the first control signal;
a plurality of bit lines connected to the plurality of NAND cells;
a shield line commonly connected to the plurality of bit lines;
a third discharge circuit which is connected between the shield line and the reference potential and configured to discharge the shield line by a third control signal; and a fourth discharge circuit which is connected between the shield line and the reference potential and configured to discharge the shield line by a fourth control signal generated by delaying the third control signal.

16. The semiconductor memory device according to claim 15, wherein the second discharge circuit comprises an n-channel MOS transistor connected between the source line and the reference potential, the fourth discharge circuit comprises, an n-channel MOS transistor connected between the shield line and the reference potential, and a breakdown voltage of the n-channel MOS transistor of the second discharge circuit is higher than a breakdown voltage of the n-channel MOS transistor of the fourth discharge circuit.

17. The semiconductor memory device according to claim 15, wherein the second discharge circuit comprises an n-channel MOS transistor connected between the source line and the reference potential, the fourth discharge circuit comprises an n-channel MOS transistor connected between the shield line and the reference potential, and a thickness of a gate oxide film of the n-channel MOS transistor of the second discharge circuit is larger than a thickness of a gate oxide film of the n-channel MOS transistor of the fourth discharge circuit.

18. The semiconductor memory device according to claim 15, wherein the first discharge circuit comprises at least two n-channel MOS transistors which are series-connected between a power supply potential and a reference potential and the source line of which is connected to a mutual connection node, the second discharge circuit comprises at least one n-channel MOS transistor connected between the source line and the reference potential, the third discharge circuit comprises at least one n-channel MOS transistor connected between the shield line and the reference potential, the fourth discharge circuit comprises at least one n-channel MOS transistor connected between the shield line and the reference potential, a driving capability of the at least one n-channel MOS transistor of the second discharge circuit is set to be lower than a driving capability of one n-channel MOS transistor connected between the mutual connection node and the reference potential among the at least two n-channel MOS transistors of the first discharge circuit, a driving capability of the at least one n-channel MOS transistor of the fourth discharge circuit is set to be lower than a driving capability of the at least one n-channel MOS transistor of the third discharge circuit, and a breakdown voltage of the at least one n-channel MOS transistor of the second discharge circuit is set to be higher than a breakdown voltage of the at least one n-channel MOS transistor of the fourth discharge circuit.

19. The semiconductor memory device according to claim 15, wherein a driving ability of a transistor constituting the first discharge circuit is lower than a driving ability of a transistor constituting the second discharge circuit, and a driving ability of a transistor constituting the third discharge circuit is lower than a driving ability of a transistor constituting the fourth discharge circuit.

20. The semiconductor memory device according to claim 15, wherein the transistors constituting the first and third discharge circuits start operating earlier than the transistors constituting the second and fourth discharge circuits.

21. The semiconductor memory device according to claim 15, wherein drive abilities of the transistors constituting the first and third discharge circuits are equal to the transistors constituting the second and fourth discharge circuits, respectively.

* * * * *